(12) United States Patent
Gabara et al.

(10) Patent No.: US 6,938,224 B2
(45) Date of Patent: Aug. 30, 2005

(54) METHOD FOR MODELING NOISE EMITTED BY DIGITAL CIRCUITS

(75) Inventors: Thaddeus John Gabara, Murray Hill, NJ (US); Samuel Suresh Martin, Gillette, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 188 days.

(21) Appl. No.: 10/079,447

(22) Filed: Feb. 20, 2002

(65) Prior Publication Data

US 2002/0147956 A1 Oct. 10, 2002

Related U.S. Application Data

(60) Provisional application No. 60/270,263, filed on Feb. 21, 2001.

(51) Int. Cl.[7] .............................................. G06F 17/50
(52) U.S. Cl. ........................ 716/1; 716/4; 716/7; 703/2; 703/14
(58) Field of Search .............................. 716/7–8, 11, 1, 716/4, 15, 17–18; 719/15, 17–18; 379/406.01; 307/126; 703/22, 2, 14

(56) References Cited

U.S. PATENT DOCUMENTS

| | | | | |
|---|---|---|---|---|
| 3,906,174 A | * | 9/1975 | Dotter, Jr. ................... 714/715 |
| 4,247,815 A | * | 1/1981 | Larsen et al. ............... 324/638 |
| 4,421,002 A | * | 12/1983 | Deutsch ....................... 84/608 |
| 5,196,920 A | * | 3/1993 | Kumamoto et al. ........ 257/798 |
| 5,475,255 A | * | 12/1995 | Joardar et al. .............. 257/547 |
| 5,481,484 A | * | 1/1996 | Ogawa et al. ................ 703/14 |
| 5,640,161 A | * | 6/1997 | Johnson et al. ............. 341/122 |
| 5,854,600 A | * | 12/1998 | Johnson et al. ............. 341/155 |
| 5,864,311 A | * | 1/1999 | Johnson et al. ............. 341/155 |
| 5,872,531 A | * | 2/1999 | Johnson et al. ............. 341/110 |
| 5,999,714 A | * | 12/1999 | Conn et al. ..................... 716/2 |
| 6,075,770 A | * | 6/2000 | Chang et al. .......... 370/395.21 |
| 6,090,151 A | * | 7/2000 | Gehman et al. ............... 716/5 |
| 6,111,470 A | * | 8/2000 | Dufour ........................ 331/17 |
| 6,135,649 A | * | 10/2000 | Feldmann et al. ............ 703/14 |
| 6,137,841 A | * | 10/2000 | Velez et al. ................. 375/298 |
| 6,234,658 B1 | * | 5/2001 | Houldsworth .................. 716/4 |
| 6,304,991 B1 | * | 10/2001 | Rowitch et al. ............ 714/755 |
| 6,330,375 B1 | * | 12/2001 | Fishman et al. .............. 385/11 |
| 6,385,565 B1 | * | 5/2002 | Anderson et al. ............. 703/18 |
| 6,405,349 B1 | * | 6/2002 | Gehman et al. ............... 716/4 |
| 6,424,022 B1 | * | 7/2002 | Wu et al. ..................... 257/665 |
| 6,523,154 B2 | * | 2/2003 | Cohn et al. ..................... 716/6 |

(Continued)

OTHER PUBLICATIONS

Chang et al. "Fully differential current–input CMOS amplifier tront–end suppressing mixed signal substrate noise for optoelectronic applications" Circuits and Systems ISCAS Proceedings of the 1999 IEEE International Symposium vol. 1 30 May 1999 Pg 327–30.*

(Continued)

Primary Examiner—Matthew Smith
Assistant Examiner—Granvill Lee

(57) ABSTRACT

A method of predicting the electromagnetic noise emitted by a digital circuit on an integrated circuit is disclosed. In accordance with the illustrative embodiment, the output of each digital circuit element in the digital circuit is considered as a bit stream. All of these bits streams are, in aggregate, considered as a noise source that is characterized by a power spectral density, $S(\omega)$. The effect of the noise source on an analog circuit can be modeled as a lumped circuit, wherein the lumped circuit contains a noise source that represents the digital circuit; a multi-port network, also referred to as a lumped element, that represents that portion of the substrate between the digital circuit and the analog circuit; and a multi-port network that represents the analog circuit.

26 Claims, 7 Drawing Sheets

U.S. PATENT DOCUMENTS 6,586,292 B2 * 7/2003 Wu et al. .................. 438/215
6,671,663 B1 * 12/2003 Hellums et al. ............. 703/14
2002/0046371 A1 * 4/2002 Halter ....................... 714/702
2002/0164851 A1 * 11/2002 Wu et al. .................. 438/215
2003/0154064 A1 * 8/2003 Gauthier et al. ............ 703/14

OTHER PUBLICATIONS

Xu et al. "Measuring and modeling the effects of substrate noise on the LNA for a CMOS GPS receiver" IEEE journal of solid–state circuits vol. 36 no. 3 Mar. 2001 Pg. 473–485.*

Heijningen et al. "Substrate noise generation in complex digital system: efficient modeling and simulation methodology and experimental verification" Digest of technical papers Solid state circuits conference )–7803–6608–5 IEEE 2001.Pg. 22.1.*

Makie–Fukuda "Substrate noise measurement by using noise–selective voltage comparators in analog and digital mixed–signal integrated circuits" IEEE Trans. on instrumetation and measurement vol. 48 No. 6 Dec. 1999 Pg. 1068–72.*

M. Van Heijningen et al. "Analysis and experimental verification of digital substrate noise generation for epi–type substrate" IEEE Journal of solid–state circuit vol. 35 no. 7 Jul. 2000 p. 1002–1008.*

Chang et al."Parameterized spice subcircuits for multilevel interconnect modeling and simulation" IEEE Trans. on circuits and systems II vol. 39 No. 11 Nov. 1992 p. 779–789.*

Vernotte et al. "A new method of measuring of the different types of noise altering the output signal of Oscillators" IEEE Trans. on Instrument. and measur. vol. 42 no. 6 Dec. 1993 p. 968–975.*

Verghese et al. "Rapid simulation of substrate coupling effects in mixed–mode IC's" IEEE custom integrated circuits conf. 1993 Pg. 18.3.1–18.3.4.*

Verghese et al. "Verification of rf and mixed–signal integrated circuits for substrate coupling effects" IEEE 1997 custom integrated circuits conference 16.1.1–16.1.8.*

Su. et al. "Experimental resuts and modeling techniques for substrate noise in mixed–signal integrated circuits" IEEE journal of solid–state circuits vol. 28 no. 4 Apr. 1992 p. 420–430.*

Stanisic et al. "Addressing substrate coupling in mixed–mode ic's: simulation and power distribution synthesis" IEEE journal of solid–state circuits vol. 29 no. 3 Mar. 1994 p. 226–238.*

* cited by examiner

METHOD FOR MODELING NOISE EMITTED BY DIGITAL CIRCUITS

CROSS-REFERENCE TO RELATED APPLICATIONS

This application claims the benefit of U.S. Provisional Patent Application Ser. No. 60/270,263, entitled "Designing Mixed Analog and Digital Circuits," filed on Feb. 21, 2001 and incorporated by reference.

FIELD OF THE INVENTION

The present invention relates to electrical and electronic devices in general, and, more particularly, to a method for modeling the electromagnetic noise emitted by those devices.

BACKGROUND OF THE INVENTION

Typically, the performance of an analog circuit is limited by both the quantity of noise striking the analog circuit and the analog circuit's tolerance to that noise. Analog circuits are particularly susceptible to the noise emitted by digital circuits.

The amount of noise emitted by a digital circuit and striking an analog circuit can be reduced by separating the analog circuit from the digital circuit. This is, however, often impractical where the analog circuit and the digital circuit are packaged in a small enclosure. For example, when an integrated circuit comprises both an analog circuit and a digital circuit, the substrate provides a conduit for conveying the noise emitted by the digital circuit to the analog circuit.

FIG. 1 depicts a hybrid analog-digital integrated circuit that comprises digital circuit 101 and analog circuit 102 on substrate 103. For the purposes of this specification, the term "integrated circuit" is defined as a slice or chip of material on which a complex of electronic components and their interconnections is etched or imprinted.

For the purposes of this specification, the term "digital circuit" is defined to comprise one or more circuit elements whose outputs are interpreted as having one of a plurality of discrete and mutually-exclusive values. Typical digital circuits comprise one or more active and passive circuit elements (e.g., transistors, diodes, resistors, capacitors, etc.) that function as processors, memories, etc.

For the purposes of this specification, the term "analog circuit" is defined to comprise one or more circuit elements whose outputs are not interpreted as having one of a plurality of discrete or mutually-exclusive values. Typical analog circuits comprise one or more active and passive circuit elements (e.g., transistors, diodes, resistors, capacitors, etc.) that function as amplifiers, detectors, etc.

In integrated circuit 100, substrate 103 rigidly fixes the relative positions of the constituent analog and digital circuits. Furthermore, substrate 103 provides a conduit for electromagnetic noise to propagate from digital circuit 101 to analog circuit 102. The extent of the noise coupling is a function of both:

1. the material properties of substrate 103, and
2. on the relative locations of digital circuit 101 and analog circuit 102 on substrate 103.

When hybrid analog-digital integrated circuits are designed, the noise emitted by a digital circuit on the integrated circuit can adversely affect the operation of an analog circuit on the integrated circuit (i.e., the noise from the digital circuit can prevent the performance of the analog circuit from achieving a design goal). Therefore, it is useful for the designer of a hybrid analog-digital integrated circuit to be able to predict the amount of noise emitted by a digital circuit on the integrated circuit that strikes an analog circuit that is also on that integrated circuit.

In the prior art, techniques such as finite element analysis have been used to predict the amount of noise emitted by a digital circuit on the integrated circuit that strikes an analog circuit that is also on that integrated circuit. These techniques are, however, computationally impractical with digital circuits that comprise a large number of circuit elements. Therefore, the need exists for a technique for predicting the amount of noise emitted by a digital circuit on the integrated circuit that strikes an analog circuit that is also on that integrated circuit when the digital circuit comprises a large number of circuit elements.

SUMMARY OF THE INVENTION

Some embodiments of the present invention are capable of facilitating the design of an integrated circuit without some of the restrictions and disadvantages of techniques for doing so in the prior art. In particular, some embodiments of the present invention are capable of predicting the electromagnetic noise emitted by a digital circuit on an integrated circuit.

In accordance with the illustrative embodiment, the output of each digital circuit element in the digital circuit is considered as a bit stream. All of these bits streams are, in aggregate, considered as a noise source that is characterized by a power spectral density, $S(\omega)$. The effect of the noise source on an analog circuit can be modeled as a lumped circuit, wherein the lumped circuit contains a noise source that represents the digital circuit; a multi-port network, also referred to as a lumped element, that represents that portion of the substrate between the digital circuit and the analog circuit; and a multi-port network that represents the analog circuit.

An illustrative embodiment is a method of evaluating the performance of a hybrid analog-digital integrated circuit having an analog unit, a digital unit, and a substrate on which the units are located, comprising: identifying a broadband power source that represents noise characteristics of the digital unit; and simulating performance of the integrated circuit by evaluating performance of a lumped circuit in which the source couples to a lumped element representing the substrate and the substrate couples to a lumped element representing the analog unit.

DETAILED DESCRIPTION

Figure 1:
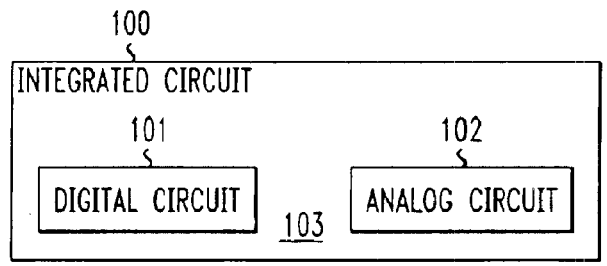
FIG. 1 depicts a diagram of an integrated circuit in the prior art.
Figure 2:
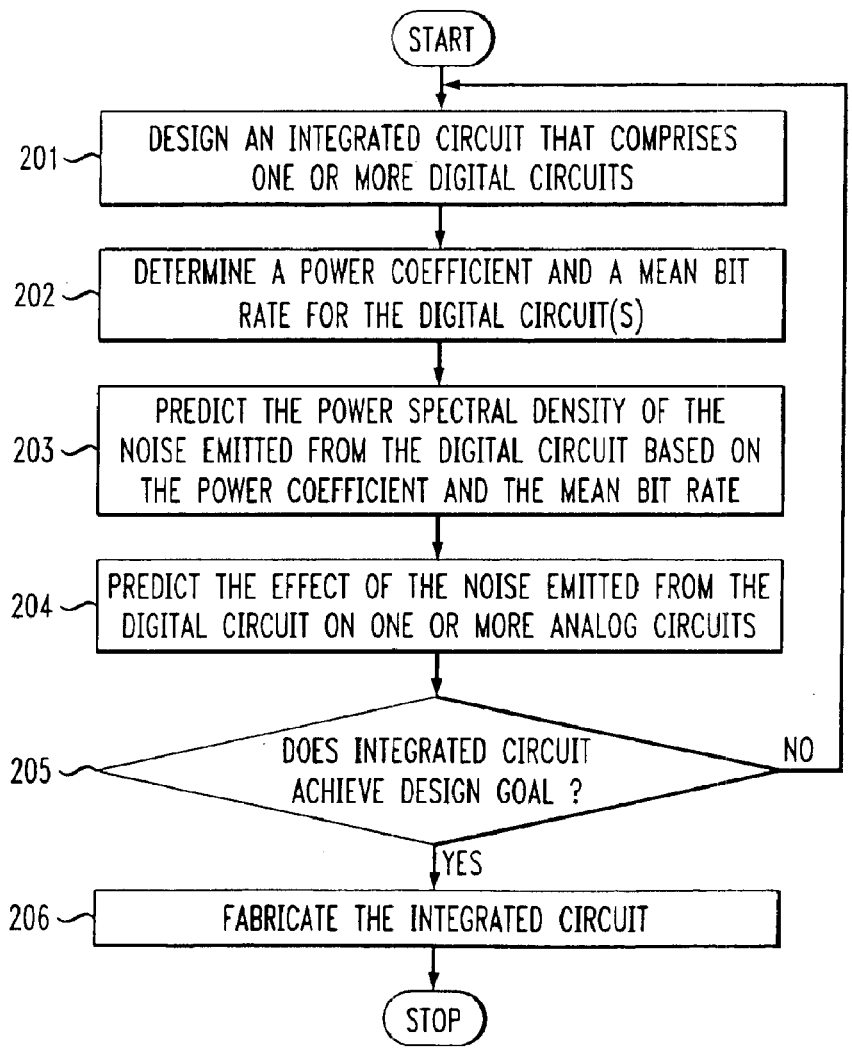
FIG. 2 depicts a flowchart of an outline of the tasks performed by the illustrative embodiment of the present invention.

FIG. 2 depicts a flowchart of the tasks associated with the illustrative embodiment of the present invention, which determines the effect of the noise emitted by one or more digital circuits on one or more analog circuits on an integrated circuit.

Figure 3:
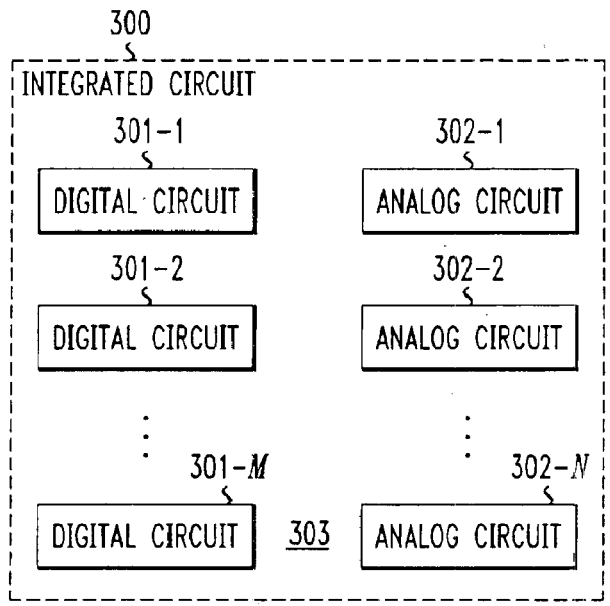
FIG. 3 depicts a diagram of an integrated circuit comprising digital circuits, analog circuits, and a substrate.

At task 201, an integrated circuit that comprises one or more digital circuits is designed in well-known fashion. FIG. 3 depicts integrated circuit 300, which comprises M digital circuits, 301-1 through 301-M, wherein M is a positive integer; N analog circuits, 302-1 through 302-N, wherein N is a positive integer, and substrate 303.

Digital circuit 301-$i$, for i=1 through M, can be informationally-connected to analog circuit 302-$j$, for j=1 through N, or not. In other words, information-bearing signals can pass between digital circuit 301-$i$ and analog circuit 302-$j$ or not. It will be clear to those skilled in the art how to design, make, and use digital circuit 301-$i$ and analog circuit 302-$j$.

Both digital circuit 301-$i$ and analog circuit 302-$j$ are fabricated on substrate 303, in well-known fashion. In accordance with the illustrative embodiment, the operation of digital circuit 301-$i$ generates electromagnetic noise (i.e., signals that are not intended to bear information) and that noise is propagated to analog circuit 302-$j$ largely through substrate 303. This noise can interfere with the operation of analog circuit 302-$j$ if the magnitude of the noise is too large. Therefore, in accordance with the illustrative embodiment, the magnitude of the noise emitted by digital circuit 301-$i$ and its effect on the operation of analog circuit 302-$j$ is predicted before either digital circuit 301-$i$ or analog circuit 302-$j$ is fabricated. This enables the design of digital circuit 301-$i$ and analog circuit 302-$j$ and their placement on substrate 303 to be modified so that a design goal for integrated circuit 300 is achieved.

Figure 4:
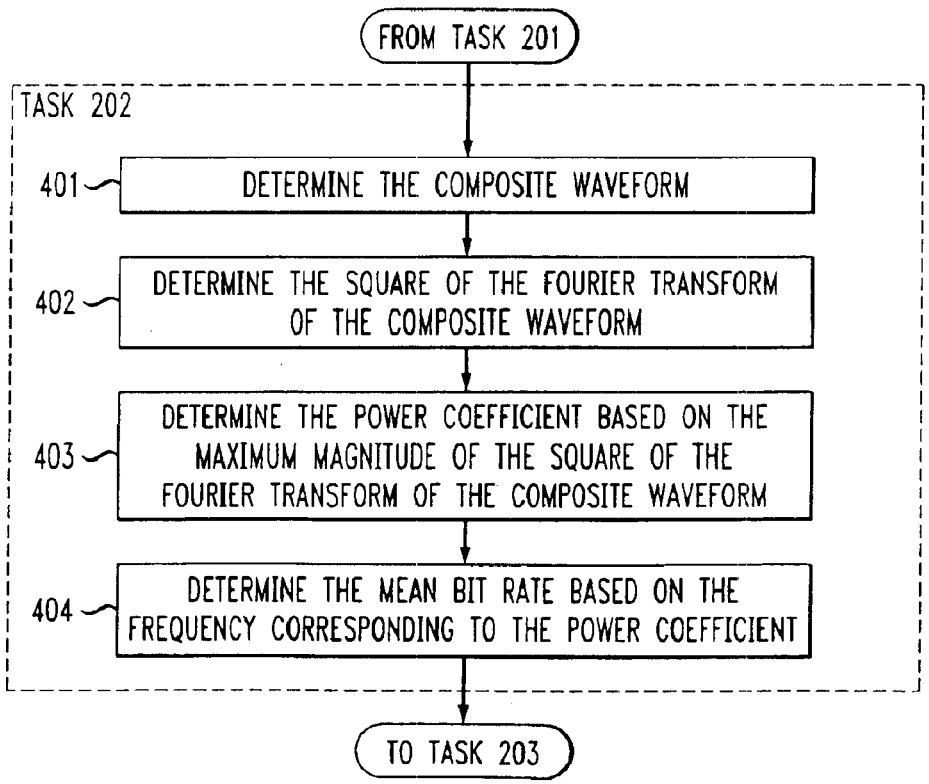
FIG. 4 depicts a flowchart of an outline of the tasks performed to determine a power coefficient and a mean bit rate for the digital circuit(s).

At task 202, a power coefficient, $S_0$, and a mean bit rate, $\bar{v}$, for digital circuit 301-$i$ are determined. The subtasks that compose task 202 are depicted in FIG. 4.

Figure 5:
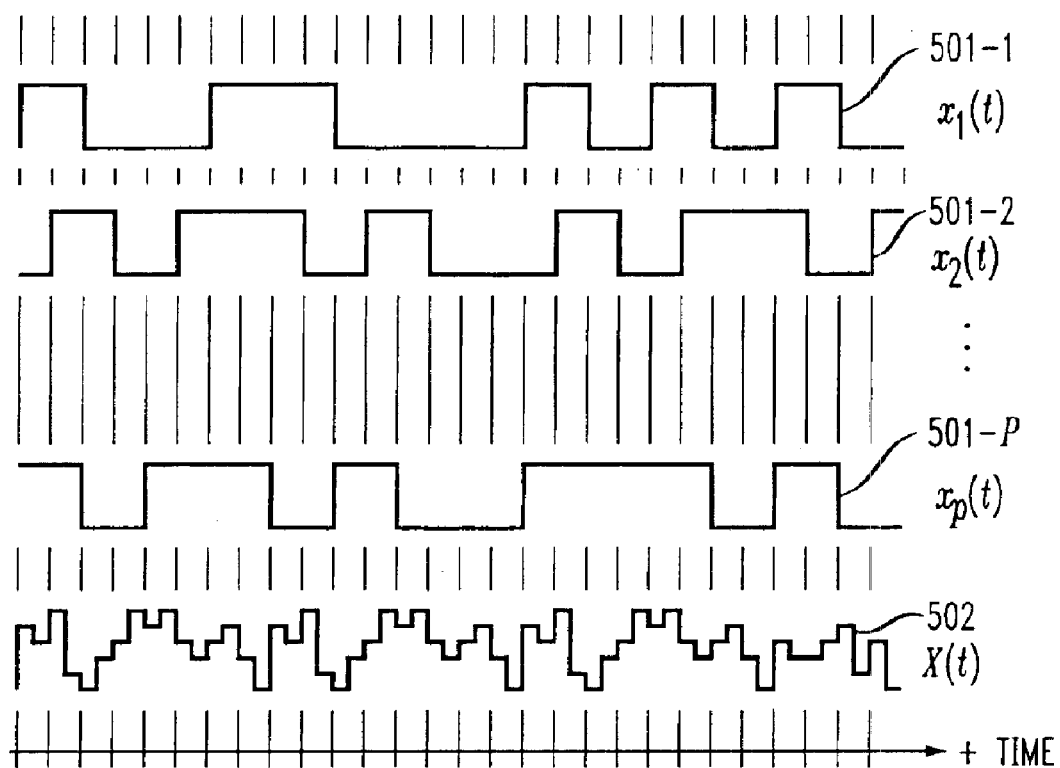
FIG. 5 depicts a plurality of bit streams representing the outputs of the digital circuit elements.

At subtask 401, the composite waveform, X(t), of digital circuit 301-$i$ is determined. The illustrative embodiment considers the noise emitted from a digital circuit to be a cacophony of bit streams. For example, FIG. 5 depicts a plurality of bit streams 501-1 through 501-P, wherein P is a positive integer, for a digital circuit comprising P circuit elements. Bit stream 501-$k$, for k=1 through P, which is represented by $x_k(t)$, depicts the output of circuit element k composing the digital circuit. Bit stream 501-$k$ can be computed using a logic simulator, in well-known fashion, or, alternatively, bit stream 501-$k$ can be estimated using a behavioral model, as is described below. When the digital circuit comprises a small number of circuit elements, a logic simulator provides a highly accurate approximation of bit stream 501-$k$ and is computationally feasible. In these cases, composite waveform 502,X(t), of bit streams 501-1 through 501-P can be computed as:

$$X(t) = \sum_{k=1}^{P} x_k(t) \qquad \text{(Eq. 1)}$$

In contrast, when the digital circuit comprises a large number of circuit elements, the use of a logic simulator might be computationally infeasible. In these cases, a behavioral model can be used to predict the characteristics of X(t). Such behavioral models are found in programs such as Affirma™ Hybrid-Signal Circuit Simulator, which is produced by Cadence Design Systems. In particular, the subprogram Verilog A of Affirma™ Hybrid-Signal Circuit Simulator provides a behavioral model for a digital circuit.

A representation of composite waveform 502 can also be derived by considering each bit stream as a series of randomly-arriving bits, represented by pulses of known shape and amplitude, wherein the start time of each pulse has a Poisson-distribution. For a large number of circuit elements, the noise characteristics of this random-event system resemble the characteristics of a system with individually-modeled circuit elements.

In any case, after subtask 401, composite waveform 502, X(t), of digital circuit 301-$i$ is determined.

Figure 6:
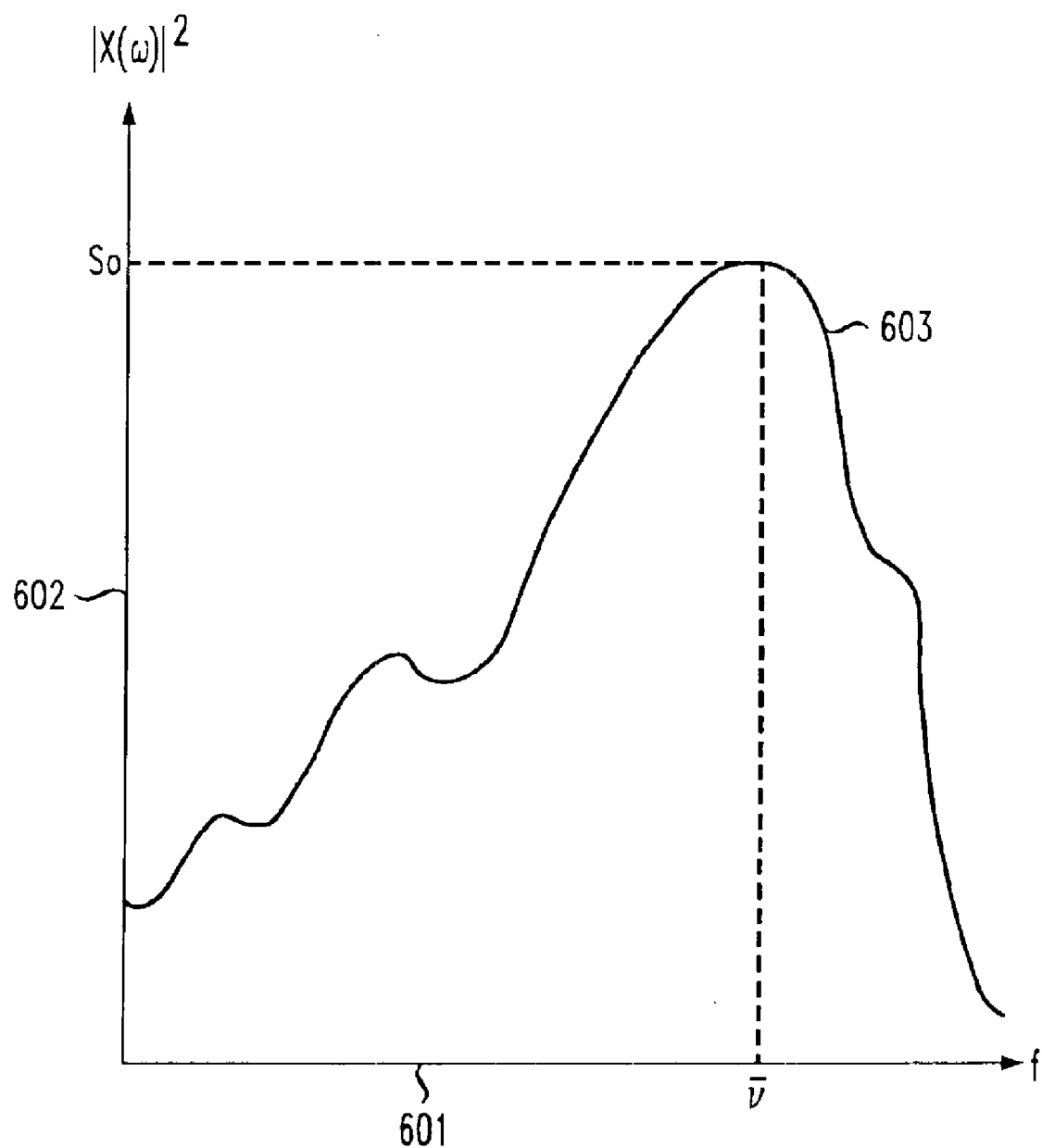
FIG. 6 depicts a graph of a Fourier transform, showing the power coefficient and the mean bit rate.

At subtask 402, the square of the Fourier transform of X(t) is computed, in well-known fashion. FIG. 6 depicts the square of the Fourier transform of an illustrative composite waveform, X(t).

At subtask 403, the power coefficient, $S_0$, is determined. In accordance with the illustrative embodiment of the present invention, the power coefficient, $S_0$, is based on the maximum magnitude of the square of the Fourier transform of X(t).

At subtask 404, the mean bit rate, $\bar{v}$, is determined. In accordance with the illustrative embodiment of the present invention, the mean bit rate, $\bar{v}$, is based on the frequency corresponding to the power coefficient, $S_0$.

Therefore, at the end of task 202, values for the power coefficient, $S_0$, and the mean bit rate, $\bar{v}$, for digital circuit 301-$i$ have been determined.

Figure 7:
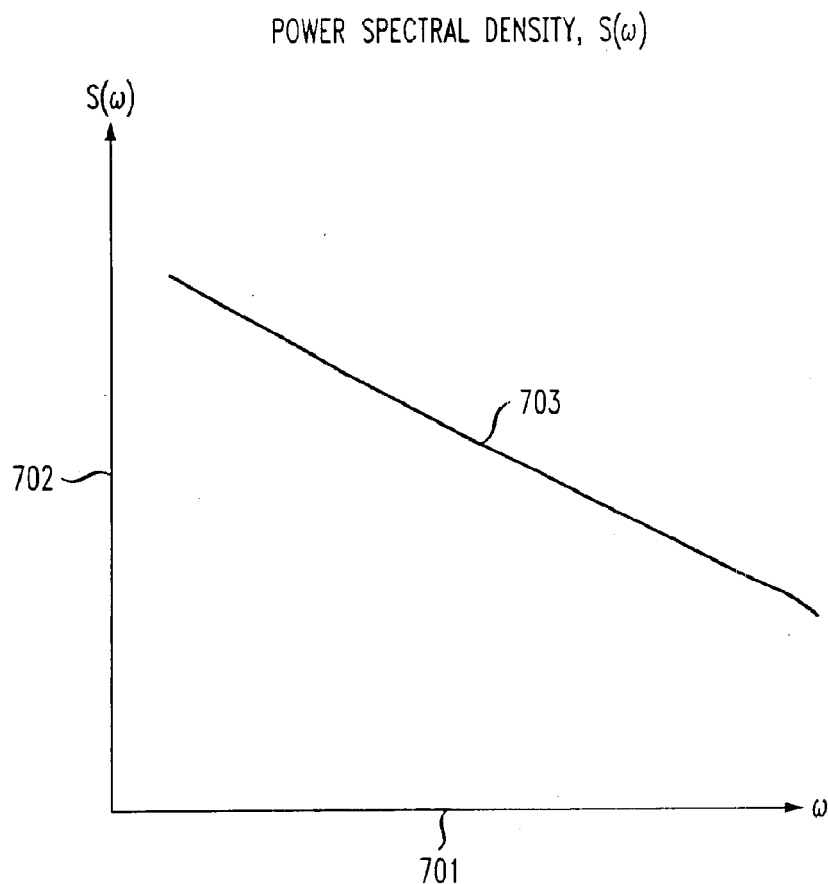
FIG. 7 depicts a power spectral density.

At task 203, the power spectral density, $S(\omega)$, of the noise emitted from digital circuit 301-$i$ is predicted based on the power coefficient, $S_0$, and the mean bit rate, v, for digital circuit 301-$i$. FIG. 7 depicts an example of the power spectral density, $S(\omega)$, of the illustrative noise emitted from digital circuit 301-$i$. The curve depicted in FIG. 7 corresponding to an example rectangular bit pulse shape is derived from:

$$S(\omega) = \frac{\frac{S_0}{\bar{v}}}{1 + \left(\frac{\omega}{2\pi\bar{v}}\right)^2}. \qquad \text{(Eq. 2)}$$

It will be clear to those skilled in the art that bit streams can alternatively comprise individual bits of non-rectangular pulse shapes. Furthermore, it will be clear to those skilled in the art how to represent the power spectral density, $S(\omega)$, for bit pulse shapes other than rectangular.

At task 204, the effect of the noise emitted from digital circuit 301-$i$ on analog circuit 302-$j$ is predicted. In accordance with the illustrative embodiment, the effect of the noise on analog circuit 302-$j$ is determined by considering substrate 303 and analog circuit 303-$j$ as multi-port networks in a lumped circuit. By doing so, the effect of the noise on analog circuit 302-*j* can be found by evaluating a lumped circuit in which a noise source based on S(ω) is coupled to a multi-port network that represents the substrate which is coupled to a multi-port network that represents the analog circuit.

Figure 8:
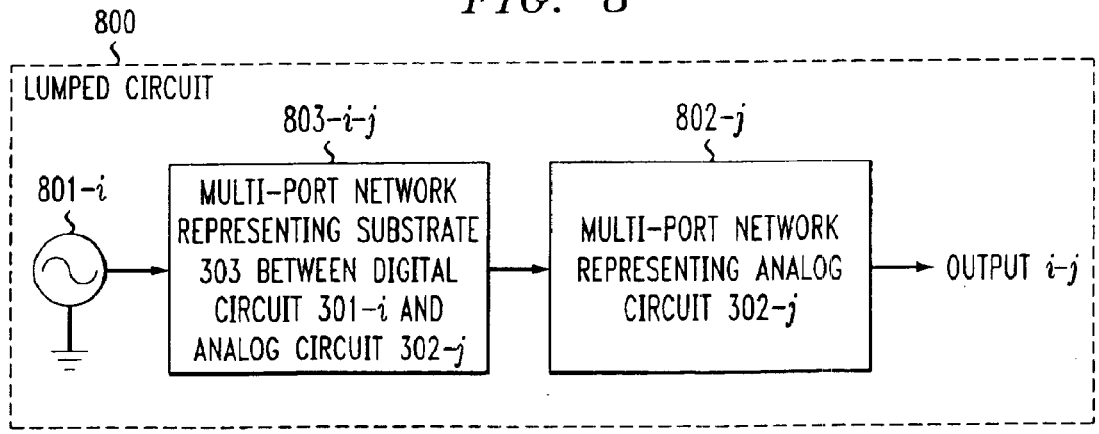
FIG. 8 depicts a diagram of a lumped circuit with one noise source.

FIG. 8 depicts a lumped circuit that can be used to model the effect of the noise emitted by digital circuit 301-*i* on analog circuit 302-*j* through that portion of substrate 303 between digital circuit 301-*i* and analog circuit 302-*j* designated as substrate 303-*i–j*.

Lumped circuit 800 comprises: noise source 801-*i*, multi-port network 803-*i–j*, which represents that portion of substrate 303 between digital circuit 301-*i* and analog circuit 302-*j*, and multi-port network 802-*j*, which represents analog circuit 302-*j*.

Noise source 801-*i* has the power spectral density of S(ω) as determined in task 203 above.

Multi-port network 803-*i–j* represents the impedance of substrate 303 between noise source 801-*i* and multi-port network 802-*j* (i.e., substrate 303-*i–j*). It will be clear to those skilled in the art how to model substrate 303-*i–j* as multi-port network 803-*i–j*.

Multi-port network 802-*j* represents the impedance of analog circuit 302-*j* between the point at which substrate 303-*i–j* couples to analog circuit 302-*j* and the point at output i-j. It will be clear to those skilled in the art how to model analog circuit 302-*j* as multi-port network 802-*j*.

The effects of noise source 801-*i* on multi-port network 802-*j* are manifest at output i-j associated with multi-port network 802-*j*.

The effects of noise source 801-*i* can be assessed anywhere in the environment of integrated circuit 300, as needed by the particular design process used.

Figure 9:
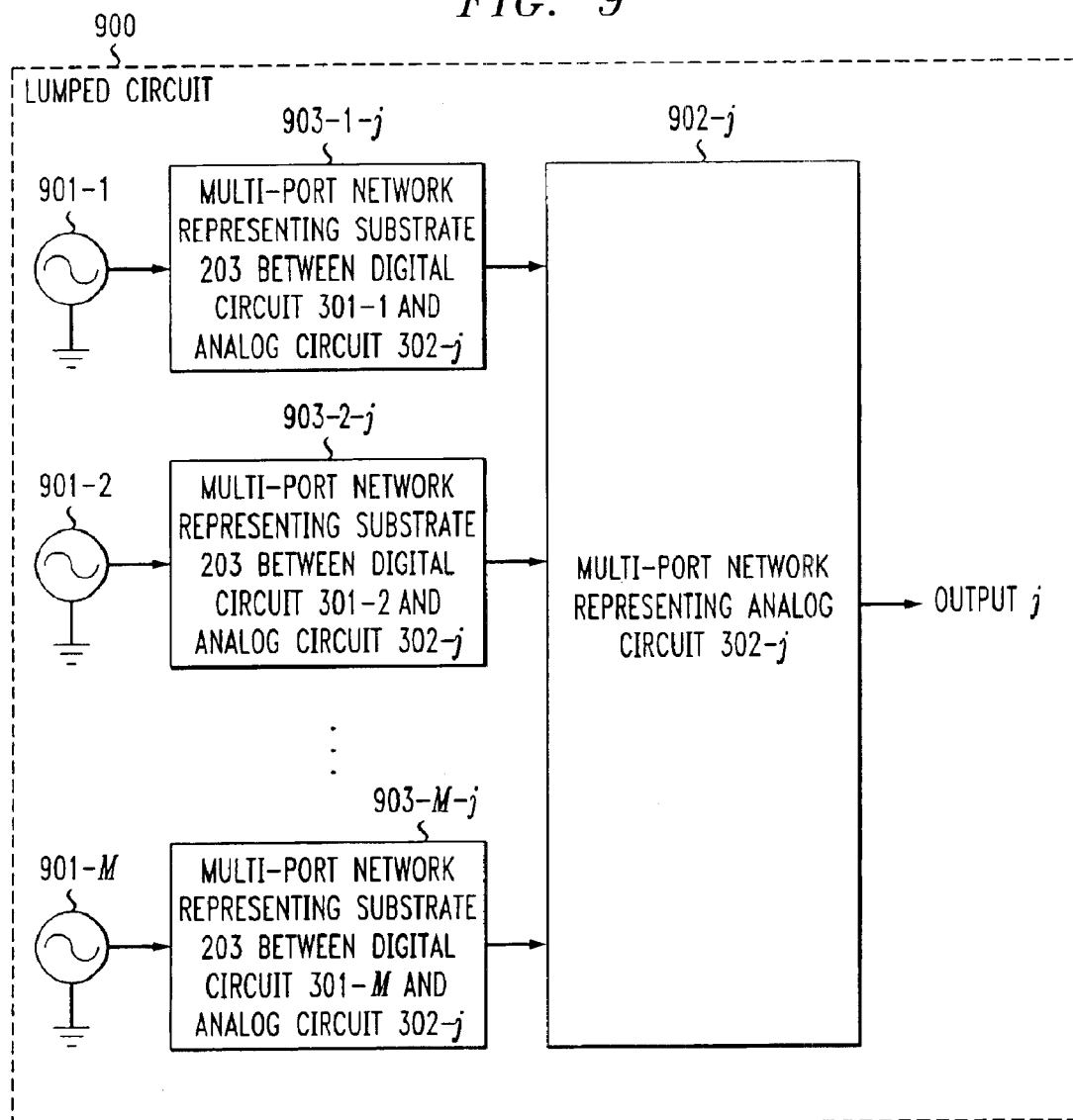
FIG. 9 depicts a diagram of a lumped circuit with a plurality of noise sources.

FIG. 9 depicts a lumped circuit that can be used to model the effect of the noise emitted by digital circuits 301-*i*, for i=1 through M, on analog circuit 302-*j* through substrate 303-*i–j*, for i=1 through M.

Lumped circuit 900 comprises: noise sources 901-*i*, for i=1 through M; multi-port networks 903-*i–j*, for i=1 to M, which represent those portions of substrate 303 between digital circuit 301-*i*, for i=1 through M, and analog circuit 302-*j*; and multi-port network 902-*j*, which represents analog circuit 302-*j*.

Noise source 901-*i* has the power spectral density of S(ω) as determined in task 203 above.

Multi-port network 903-*i–j* represents the impedance of substrate 303 between noise source 901-*i* and multi-port network 902-*j* (i.e., substrate 303-*i–j*). It will be clear to those skilled in the art how to model substrate 303-*i–j* as multi-port network 903-*i–j*.

Multi-port network 902-*j* represents the impedance of analog circuit 302-*j* between the points at which substrate 303-*i–j*, for i=1 through M, couple to analog circuit 302-*j* and the point at output j. It will be clear to those skilled in the art how to model analog circuit 302-*j* as multi-port network 902-*j*.

The effects of noise source 901-*i*, for i=1 through M, on multi-port network 902-*j* are manifest at output j associated with multi-port network 902-*j*.

The effects of noise source 901-*i*, for i=1 through M, can be assessed anywhere in the environment of integrated circuit 300, as needed by the particular design process used.

Figure 10:
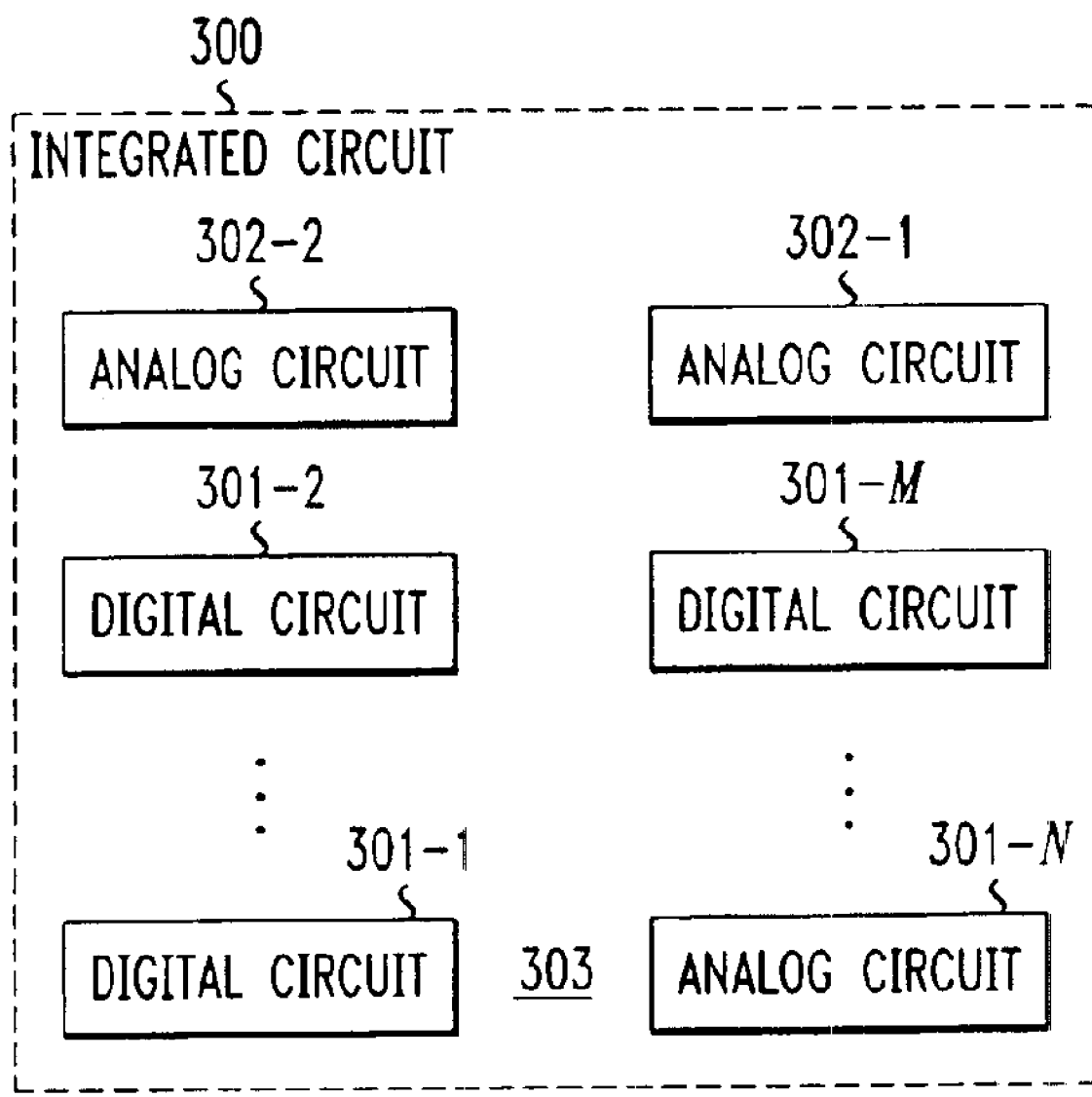
FIG. 10 depicts a diagram of an integrated circuit being designed.

FIG. 10 depicts an example of integrated circuit 300 being designed. Integrated circuit 300 comprises M digital circuits, 301-1 through 301-M, wherein M is a positive integer; N analog circuits, 302-1 through 302-N, wherein N is a positive integer, and substrate 303. The relative layout of the circuits on substrate 303 is dictated by the current iteration in the design. The circuits can be informationally-connected or not. The circuits are coupled to each other via substrate 303, and can be modeled as a collection of noise sources representing digital circuits 301-1 through 301-M and multi-port networks representing analog circuits 302-1 through 302-N and substrate 303.

At task 205, the power spectral density, S(ω), representing the electromagnetic noise generated by digital circuit 301-*i* is compared against a design goal to determine if the design goal has been achieved. S(ω) can be compared directly against a design goal representing digital circuit 301-*i*, or S(ω) can be adjusted by the characteristics of lumped circuit 900 and compared against a design goal representing integrated circuit 300 at output j. It is to be understood that S(ω) can be adjusted and compared against a design goal in some other fashion appropriate for the specific design being considered. If the goal in task 205 has not been achieved, the tasks are repeated, beginning with task 201, incorporating a design change to digital circuit 301-*i*, analog circuit 302-*j*, substrate 303, or a combination thereof.

At task 206, the design goal having been achieved, integrated circuit 300 is fabricated in well-known fashion.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. A method of evaluating the performance of a hybrid analog-digital integrated circuit having an analog unit, a digital unit, and a substrate on which the units are located, comprising:

identifying a broadband power source that represents noise characteristics of the digital unit; and simulating performance of the integrated circuit by evaluating performance of a lumped circuit in which the source couples to a lumped element representing the substrate and the substrate couples to a lumped element representing the analog unit.

2. The method of claim 1, wherein the identifying includes evaluating one or more characteristics of the power source based on a behavioral simulation model for the digital unit.

3. The method of claim 1, further comprising:

repeating the identifying and simulating for another digital unit; and selecting one of the two digital units based on the simulating showing that the integrated circuit has a better performance with the one of the units.

4. The method of claim 1, further comprising:

repeating the simulating for a lumped element representing another substrate; and selecting a better one of the two substrates based on the performances determined by the acts of simulating.

5. A program storage medium encoding a computer executable program of instructions for evaluating the performance of a hybrid analog-digital integrated circuit having an analog unit, a digital unit, and a substrate on which the units are located, the instructions to cause the computer to:

identify a broadband power source that represents noise characteristics of the digital unit; and simulate performance of the integrated circuit by evaluating performance of a lumped circuit in which the source couples to a lumped element representing the substrate and the substrate couples to a lumped element representing the analog unit.

6. The medium of claim 5, wherein the instruction to identify evaluates one or more characteristics of the power source based on a behavioral simulation model for the digital unit.

7. The medium of claim 5, wherein the instructions further cause the computer to:
repeat the identifying and simulating for another digital unit; and
select one of the two digital units based on the simulating showing that the integrated circuit has a better performance with the one of the units.

8. The medium of claim 5, wherein the instructions further cause the computer to:
repeat the simulating for a lumped element representing another substrate; and
select a better one of the two substrates based on the performances determined by the acts of simulating.

9. A method comprising:
identifying a candidate integrated circuit that comprises a candidate digital circuit;
determining a power coefficient, $S_0$, of said candidate digital circuit;
predicting a power spectral density, $S(\omega)$, of said candidate digital circuit based on said power coefficient, $S_0$, of said candidate digital circuit; and
fabricating said candidate integrated circuit when said power spectral density, $S(\omega)$, of said candidate digital circuit achieves a design goal for said candidate integrated circuit.

10. The method of claim 9 further comprising determining a mean bit rate, $\bar{v}$, of said candidate digital circuit, wherein said power spectral density, $S(\omega)$, of said candidate digital circuit is based on said power coefficient, $S_0$, and on said mean bit rate, $\bar{v}$.

11. The method of claim 9 wherein said candidate integrated circuit further comprises a candidate analog circuit.

12. The method of claim 11 further comprising evaluating a lumped circuit in which a noise source based on $S(\omega)$ is coupled to a multi-port network that represents a candidate substrate which is coupled to a multi-port network that represents said candidate analog circuit.

13. The method of claim 9 wherein said candidate integrated circuit comprises a plurality of candidate digital circuits.

14. The method of claim 9 wherein said power coefficient, $S_0$, is based on the number of switching devices composing said candidate digital circuit.

15. The method of claim 9 wherein said power coefficient, $S_0$, is based on the clock rate of said candidate digital circuit.

16. The method of claim 9 wherein said power coefficient, $S_0$, is based on a plurality of voltage levels of said candidate digital circuit.

17. The method of claim 9 wherein said power coefficient, $S_0$, is based on an activity factor of said candidate digital circuit.

18. A method comprising:
identifying a candidate integrated circuit that comprises a candidate digital circuit;
determining a mean bit rate, $\bar{v}$, of said candidate digital circuit;
predicting a power spectral density, $S(\omega)$, of said candidate digital circuit based on said mean bit rate, $\bar{v}$, of said candidate digital circuit; and
fabricating said candidate integrated circuit when said power spectral density, $S(\omega)$, of said candidate digital circuit achieves a design goal for said candidate integrated circuit.

19. The method of claim 18 further comprising determining a power coefficient, $S_0$, of said candidate digital circuit, wherein said power spectral density, $S(\omega)$, of said candidate digital circuit is based on said power coefficient, $S_0$, and on said mean bit rate, $\bar{v}$.

20. The method of claim 18 wherein said candidate integrated circuit further comprises a candidate analog circuit.

21. The method of claim 20 further comprising evaluating a lumped circuit in which a noise source based on $S(\omega)$ is coupled to a multi-port network that represents a candidate substrate which is coupled to a multi-port network that represents said candidate analog circuit.

22. The method of claim 18 wherein said candidate integrated circuit comprises a plurality of candidate digital circuits.

23. The method of claim 18 wherein said mean bit rate, $\bar{v}$, is based on the number of switching devices composing said candidate digital circuit.

24. The method of claim 18 wherein said mean bit rate, $\bar{v}$, is based on the clock rate of said candidate digital circuit.

25. The method of claim 18, wherein said mean bit rate, $\bar{v}$, is based on a plurality of voltage levels of said candidate digital circuit.

26. The method of claim 18 wherein said mean bit rate, $\bar{v}$, is based on an activity factor of said candidate digital circuit.

* * * * *